United States Patent [19]

Birangi et al.

[11] Patent Number: 5,471,505
[45] Date of Patent: Nov. 28, 1995

[54] METHOD AND APPARATUS FOR INCREASING THE RESOLUTION OF A DIGITAL TO ANALOG CONVERTED PULSE WIDTH MODULATED SIGNAL

[75] Inventors: Tourang Birangi, Eastlake; Joseph C. Nemer, Mayfield Heights, both of Ohio

[73] Assignee: Elsag International N.V., Amsterdam, Netherlands

[21] Appl. No.: 130,178

[22] Filed: Oct. 1, 1993

[51] Int. Cl.⁶ .................................................. H03K 7/08
[52] U.S. Cl. .......................... 375/238; 341/145; 341/131
[58] Field of Search ................................ 375/22; 341/53, 341/110, 131, 145, 151, 152; 332/109; 360/45

[56] References Cited

U.S. PATENT DOCUMENTS

| | | | |
|---|---|---|---|
| 4,233,591 | 11/1980 | Murata et al. | 341/145 |
| 4,590,457 | 5/1986 | Amir | 341/145 |
| 4,926,174 | 5/1990 | Fiori, Jr. | 341/110 |
| 4,963,870 | 10/1990 | Obinata | 341/145 |
| 5,103,462 | 4/1992 | Elle et al. | 375/22 |

Primary Examiner—Stephen Chin
Assistant Examiner—Timothy J. May
Attorney, Agent, or Firm—Michael M. Rickin

[57] ABSTRACT

A method and apparatus for increasing the resolution of a pulse width modulated signal representative of a measured parameter such as the pressure measured by a pressure cell. The analog signal from the pressure cell is converted to a digital signal using a predetermined clock frequency. The digital signal is scaled to $2^N$ (N is an integer greater than or equal to one) times the clock frequency and the N lowest order bits are checked to determine if they are a one or a zero. A one is added to the least significant bit of the scaled digital signal in a predetermined manner in the next N consecutive cycles of the scaled digital signal dependent upon the which of the N lowest order bits are a one.

10 Claims, 1 Drawing Sheet

METHOD AND APPARATUS FOR INCREASING THE RESOLUTION OF A DIGITAL TO ANALOG CONVERTED PULSE WIDTH MODULATED SIGNAL

FIELD OF THE INVENTION

This invention relates to pulse width modulated (PWM) signals and more particularly to the resolution obtained when such a signal is converted to an analog signal.

DESCRIPTION OF THE PRIOR ART

Pressure transmitters provide an analog output signal that varies from 4 to 20 milliamperes as a function of the pressure sensed by the transmitter. The pressure transmitter is designed to sense pressure over a range of predetermined pressure in engineering units such as psi. In order to sense the pressure the transmitter includes a pressure cell.

The analog output signal from the transmitter represents the sensed pressure as a percentage of the range of pressure that can be sensed by the transmitter. Therefore, when the sensed pressure is at 0% the analog output signal is at 4 milliamperes and when the sensed pressure is at 100% the analog output signal is at 20 milliamperes.

Reduction in size of electronic components and increased reliability for those components have allowed microprocessors to be incorporated in pressure transmitters. When microprocessors are used, the analog signal from the pressure cell must be converted into a digital signal at the input to the microprocessor. The PWM technique is often used in many applications to encode an analog signal into a digital signal. The digital signal at the output of the microprocessor must be converted into an analog signal to thereby provide the milliampere amplitude representative of sensed pressure at the output of the transmitter.

The PWM signal at the output of the microprocessor has a pulse width which is directly related to the sensed pressure. That signal is passed through a digital to analog (D/A) converter which includes therein a low pass filter to thereby convert the PWM signal to the analog output signal. Ideally the analog signal at the transmitter output should either increase or decrease in amplitude by a predetermined amount when the pressure sensed by the cell either increases or decreases by a predetermined amount in order for the transmitter to provide a true indication of the pressure. However, it is not always possible to obtain the exact increase or decrease in amplitude as the resolution of the analog output signal is limited by the clock frequency of the microprocessor and the frequency of the PWM signal. It is desirable to increase the resolution of the PWM signal and therefore the resolution of the analog output signal without increasing the clock frequency or decreasing the PWM frequency.

SUMMARY OF THE INVENTION

A method for use in an instrument that measures a parameter of a process and provides an output signal representative of the measured process parameter. The instrument has a computing device and the computing device has a clock signal having a predetermined number of cycles per second. The method is for increasing the resolution of the output signal and has at least the steps of:

a) measuring the process parameter and developing an analog signal representative of the measured process parameter;

b) converting the analog signal representative of the measured process parameter to a pulse width modulated signal which has a least significant bit and N lower order bits one of which is the least significant bit and a predetermined number of cycles per second; and c) determining in the computing device if the resolution of a cycle of the pulse width modulated signal is to be increased.

This determination is made up of at least the steps of:

i. scaling the pulse width modulated signal to $2^N$ times the predetermined number of clock signal cycles per second where N is a positive nonzero integer; and ii. determining if each of the N lower order bits of the pulse width modulated signal have a value of one.

If the determination finds that any of the N lower order bits in a cycle of the scaled pulse width modulated digital signal have a value of one, the method uses the computing device to increase the resolution of the cycle of the pulse width modulated signal by adding in $2^N$ consecutive cycles of the clock signal a value of one to the least significant bit of the pulse width modulated signal in a pattern determined by which of the N lower order bits of the scaled pulse width modulated signal have a value of one.

An instrument that measures a parameter of a process and provides a resolution increased output signal representative of the measured process parameter, the instrument has at least:

a) means for measuring the process parameter and developing an analog signal representative of the measured process parameter;

b) means including a computing device for converting the analog signal representative of the measured process parameter to a pulse width modulated signal having a least significant bit and N lower order bits one of which is the least significant bit and a predetermined number of cycles per second.

The computing device has a clock signal having a predetermined number of cycles per second. The computing device is for determining if the resolution of a cycle of the pulse width modulated signal is to be increased and increasing the resolution based upon the determination. The computing device has at least:

i. means for scaling the pulse width modulated signal to $2^N$ times the predetermined number of clock signal cycles per second where N is a positive nonzero integer;

ii. means for determining if each of the N lower order bits of the scaled pulse width modulated signal have a value of one; and iii. means for increasing in the computing device the resolution of the cycle of the pulse width modulated signal if any of the N lower order bits in the cycle of the scaled pulse width modulated signal have a value of one by adding in $2^N$ consecutive cycles of the clock signal a value of one to the least significant bit of the pulse width modulated signal in a pattern determined by which of the N lower order bits of the scaled pulse width modulated signal have a value of one.

DESCRIPTION OF THE DRAWING

FIG. 2a shows three readings for the pressure sensed by cell 12 of transmitter 10.

FIG. 2b shows three PWM signals which correspond to the three readings of FIG. 2a.

FIG. 2c shows three amplitudes for the analog output signal of the transmitter that correspond to the three PWM signals of FIG. 2b.

DESCRIPTION OF THE PREFERRED EMBODIMENT(S)

Figure 1:
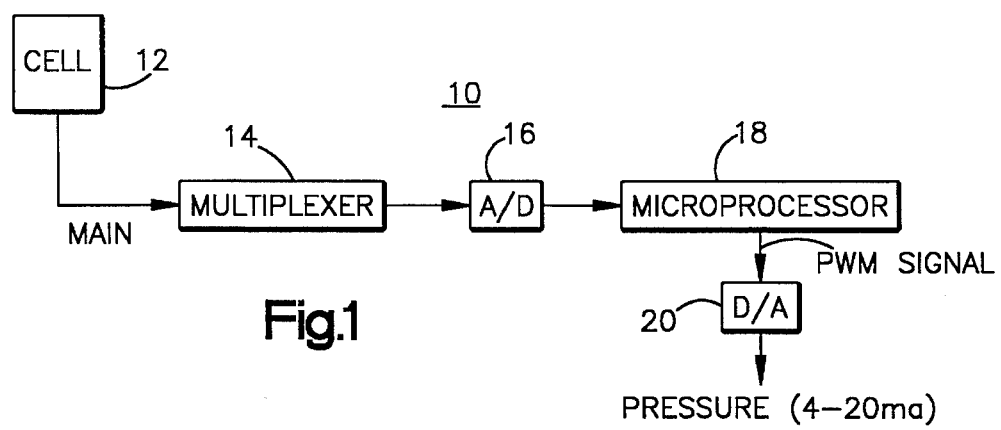
FIG. 1 shows a block diagram of that part of a transmitter which includes the method of the present invention.

Referring now to FIG. 1, there is shown a block diagram of that portion of a pressure transmitter 10 which includes the method of the present invention. Pressure transmitter 10 includes pressure cell 12 which is used to sense the pressure. The sensed pressure, designated in FIG. 1 as MAIN, is provided as one of the inputs to a multiplexor 14. For ease of illustration, the other inputs to multiplexor 14 are not shown in FIG. 1.

The output of multiplexor 14 is connected to an analog to digital converter 16 whose output is connected to one input of microprocessor 18. Associated with the microprocessor 18 is a read only memory (not shown) which has therein the resolution increasing method of the present invention in the form of instructions to be executed by the microprocessor.

The output of the microprocessor 18, which is a PWM signal, is connected to D/A converter 20 which includes therein a low pass filter. The output of the converter 20 is the 4–20 milliampere analog signal which is representative of the pressure sensed by cell 12.

The resolution of the analog output signal is a function of the clock frequency of the microprocessor 18 and the PWM frequency. Specifically the resolution is inversely related to the number of clock cycles that can fit into one PWM cycle and can be expressed as:

$$\text{Resolution} = \frac{1}{\frac{\text{ClockFreq}}{\text{PWMFreq}}} = \frac{1}{\frac{\text{PWMCycle}}{\text{ClockDutyCycle}}} \quad (1)$$

where Clock Freq is the clock frequency of the microprocessor 18 and PWM Freq is the frequency of the PWM signal. If the Clock Freq is designated as CF and the PWM Freq is designated as PWMF then the resolution can be expressed as:

$$\text{Resolution} = \frac{1}{\frac{CF}{PWMF}} \quad (2)$$

The percent resolution can be expressed as:

$$\% \text{ Resolution} = \frac{PWMF}{CF} \times 100 \quad (3)$$

In one embodiment for transmitter 10, the PWMF was 120 Hz and the CF was 460.8 KHz thereby giving 3840 clock cycles in each PWM cycle.

The PWM signal is connected to converter 20 which as described above includes a low pass filter. The low pass filter functions as an averaging circuit to thereby generate the analog output signal whose ability to change in amplitude with a change in sensed pressure is limited by the resolution.

Figures 2A, 2B, 2C:
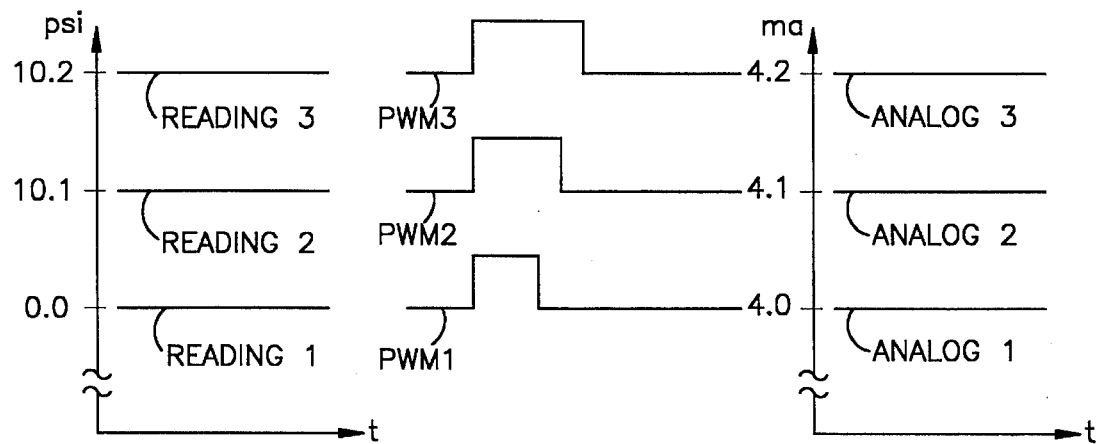

Referring now to FIGS. 2a, 2b and 2c there is shown in FIG. 2a three readings, denoted as 1, 2 and 3, for the pressure sensed by cell 12, in FIG. 2b the three PWM signals 19 corresponding to the three pressure readings and in FIG. 2c the three analog signals corresponding to the three pressure readings that should appear at the output of transmitter 10. Solely for purposes of explanation of the resolution increasing method of the present invention it is assumed in FIG. 2a that pressure reading 1 corresponds to 10 psi, pressure reading 2 corresponds to 10.1 psi and pressure reading 3 corresponds to 10.2 psi. As can be seen from FIG. 2b, the width of the pulse in the PWM signal increases as the pressure reading increases. For purposes of this explanation the increase in width of the pulse has been exaggerated in FIG. 2b.

Also solely for purposes of explanation, it is assumed in FIG. 2c that the amplitude of the analog output signal should be 4.0 milliamperes for pressure reading 1, should be 4.1 milliamperes for pressure reading 2 and should be 4.2 milliamperes for pressure reading 3. Without the resolution increasing method of the present invention the analog output signal would not have the 4.1 milliampere amplitude but instead would remain at the 4.0 milliampere amplitude as the pressure increased from reading 1 to reading 2. Only when the pressure increased to reading 3 would the analog output signal change in amplitude from 4.0 milliamperes to 4.2 milliamperes. However, as is described below in connection with the flow diagram of FIG. 3, when the resolution increasing method of the present invention is included in transmitter 10 the analog output signal will increase from 4.0 milliamperes to 4.1 milliamperes when the pressure increases from reading 1 to reading 2 without any increase in processing time in D/A converter 20.

Figure 3:
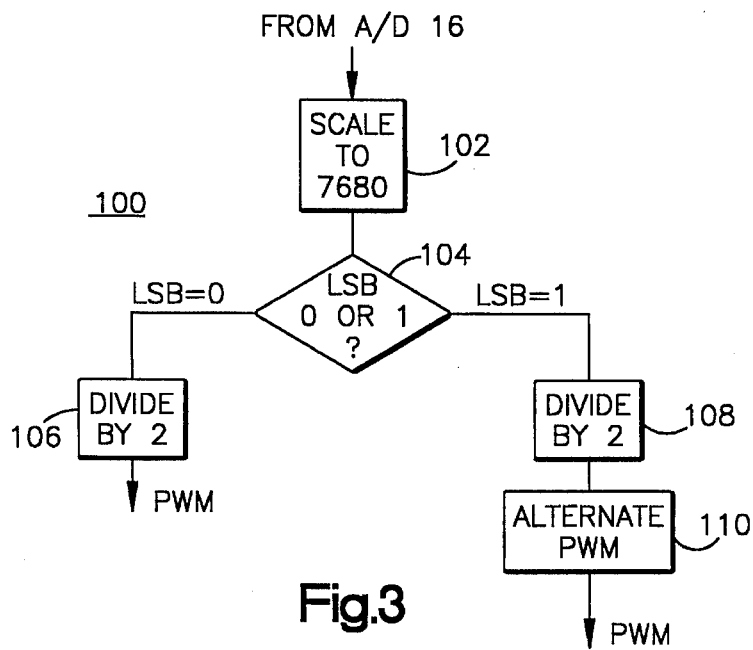
FIG. 3 shows a flow diagram for a set of instructions contained in the read only memory of the microprocessor of FIG. 1 which implement the method of the present invention.

Referring now to FIG. 3, there is shown a flow diagram 100 of a set of instructions contained in the read only memory of microprocessor 18 which implement the method of the present invention. As will be described in more detail below, the method of the present invention examines the digitized MAIN signal at the input to microprocessor 18 to determine if the PWM signal should remain constant in pulse width or should be alternated between the presently occurring pulse width and the next highest pulse width if the pressure is increasing or the next lowest pulse width if the pressure is decreasing. If the PWM signal is alternated between the presently occurring pulse width and the next highest or lowest pulse width then the average of the PWM signal provided by the low pass filter of D/A converter 20 will be an analog output signal whose amplitude is halfway between the analog output signal amplitude corresponding to the presently occurring pulse width and the analog output signal amplitude corresponding to the next highest or next lowest pulse width. Therefore, the method of the present invention will double the number of amplitude steps in the analog output signal thereby doubling the resolution of the transmitter output signal.

The method of the present invention is based on treating the input signal to the method, which is the digitized number from converter 16 (see FIG. 1) representative of sensed MAIN pressure, as if the number of clock cycles in each PWM cycle was increased. That increase in the number of clock cycles is referred to hereinafter as scaling. As described above, each PWM cycle has in the one embodiment for the present invention described herein 3840 clock cycles. In that one embodiment the method of the present invention is based on double the number of clock cycles in each PWM cycle. The doubling is not obtained by actually increasing the number of clock cycles in each PWM cycle but rather by treating the input to the method as if the number of clock cycles had been doubled. That treatment is provided by step 102 which scales the digitized number representative of the sensed MAIN pressure from converter 16 (see FIG. 1) for twice the number of clock cycles in each PWM cycle, that is, for 7680 clock cycles. In step 104 the least significant bit (LSB) of the scaled digitized number is checked to determine if it is a zero or a one. If the LSB is a zero then the PWM signal will not be alternated between the presently occurring pulse width and the next highest or lowest pulse width. If the LSB is a one then the PWM signal will be alternated between the presently occurring pulse width and the next highest or lowest pulse width.

If the LSB is a zero then in step 106 the scaled digitized number is divided by two and placed in a register in microprocessor 18. Step 106 is necessary in the embodiment for transmitter 10 being described herein because the register in the microprocessor can only hold a maximum count of 3840. It should be appreciated that when the LSB is a zero, the count in the register is the pulse width of the PWM signal as the width does not alternate.

If the LSB is a one then in step 108 the scaled digitized number is divided by two and placed in a register in microprocessor 18. Step 108 is necessary in the embodiment for transmitter 10 being described herein because the register in the microprocessor can only hold a maximum count of 3840. The count in the register associated with step 108 is then in step 110 changed by adding a one thereto and not adding a one thereto on each successive clock cycle. This change in the count on each successive clock cycle causes the PWM signal to alternate between the presently occurring pulse width and the next highest or lowest pulse width.

While the invention has been described above as providing the doubling of the resolution of the PWM signal it should be appreciated that the principles associated with the invention allow it to be easily used to provide a $2^N$ increase in resolution where N is any positive nonzero integer. The example given below should be sufficient to illustrate this point.

Assume it is desired to provide a fourfold increase in the resolution of the PWM signal. In that instance N=2. Assume further that without the method of the present invention in the microprocessor 18, the amplitude of the analog signal at the output of converter 20 would change from 4 ma to 5 ma as the pressure measured by cell 12 increased. As will be described in more detail below, the method of the present invention allows the analog output signal to have one of four possible amplitudes between 4.0 ma and 5.0 ma, namely, either 4.0 ma. 4.25 ma, 4.50 ma or 4.75 ma.

With the method of the present invention in microprocessor 18, the digitized number from converter 16 would be scaled in step 102 for four times the number of clock cycles in each PWM cycle. In step 104 the two least significant bits (LSB1 and LSB2) would each be checked to determine if they are a zero or a one. The two least significant bits are sufficient to define the four possible amplitudes that the analog output signal may have between 4.0 ma and 5.0 ma. The following table shows the amplitude of the analog signal at the output of converter 20 depending on the values of LSB1 and LSB2.

| Analog Signal Amplitude | LSB2 | LSB1 |
|---|---|---|
| 4 ma | 0 | 0 |
| 4.25 ma | 0 | 1 |
| 4.50 ma | 1 | 0 |
| 4.75 ma | 1 | 1 |

In step 110 to obtain an analog output signal amplitude of:
 a) 4.25 ma a one will be added once in each group of four clock cycles;
 b) 4.50 ma a one will be added twice in each group of four clock cycles; and
 c) 4.75 ma a one will be added three times in each group of four clock cycles.

Therefore, a one will be added to the least significant bit of the scaled digital signal in a predetermined manner in four consecutive cycles of the clock frequency dependent upon which of the two least significant bits of the scaled digital signal is a one.

From the description given above those skilled in the art will easily deduce how the invention can be used to provide an eightfold, sixteenfold, etc. increase in resolution.

It is to be understood that the description of the preferred embodiment(s) is (are) intended to be only illustrative, rather than exhaustive, of the present invention. Those of ordinary skill will be able to make certain additions, deletions, and/or modifications to the embodiment(s) of the disclosed subject matter without departing from the spirit of the invention or its scope, as defined by the appended claims.

What is claimed is:

1. In an instrument that measures a parameter of a process and provides an output signal representative of said measured process parameter, said instrument having a computing device therein, said computing device having a clock signal having a predetermined number of cycles per second, a method for increasing the resolution of said output signal comprising the steps of:

a) measuring said process parameter and developing an analog signal representative of said measured process parameter;

b) converting said analog signal representative of said measured process parameter to a pulse width modulated signal having a least significant bit, N lower order bits one of which is said least significant bit and a predetermined number of cycles per second; and c) determining in said computing device if the resolution of a cycle of said pulse width modulated signal is to be increased comprising the steps of:

i. scaling said pulse width modulated signal to $2^N$ times said predetermined number of clock signal cycles per second where N is a positive nonzero integer; and ii. determining if each of said N lower order bits of said scaled pulse width modulated signal have a value of one; and d) increasing in said computing device the resolution of said cycle of said pulse width modulated signal if any of said N lower order bits in said cycle of said scaled pulse width modulated signal have a value of one by adding in $2^N$ consecutive cycles of said clock signal a value of one to said least significant bit of said pulse width modulated signal in a pattern determined by which of said N lower order bits of said scaled pulse width modulated signal have a value of one.

2. The method of claim 1 wherein N is one.

3. The method of claim 1 further comprising the step of converting said resolution increased pulse width modulated signal to a resolution increased analog output signal representative of said measured process parameter.

4. An instrument that measures a parameter of a process and provides a resolution increased output signal representative of said measured process parameter, said instrument comprising:

a) means for measuring said process parameter and developing an analog signal representative of said measured process parameter; and b) means including a computing device for converting said analog signal representative of said measured process parameter to a pulse width modulated signal having a least significant bit, N lower order bits one of which is said least significant bit and a predetermined number of cycles per second;

said computing device having a clock signal having a predetermined number of cycles per second, said computing device for determining if the resolution of a cycle of said pulse width modulated signal is to be increased and increasing said resolution based upon said determination, said computing device comprising:

i. means for scaling said pulse width modulated signal to $2^N$ times said predetermined number of clock signal cycles per second where N is a positive nonzero integer;

ii. means for determining if each of said N lower order bits of said scaled pulse width modulated signal have a value of one; and iii. means for increasing in said computing device the resolution of said cycle of said pulse width modulated signal if any of said N lower order bits in said cycle of said scaled pulse width modulated signal have a value of one by adding in $2^N$ consecutive cycles of said clock signal a value of one to said least significant bit of said pulse width modulated signal in a pattern determined by which of said N lower order bits of said scaled pulse width modulated signal have a value of one.

5. The instrument of claim 4 wherein N is one.

6. The instrument of claim 4 further comprising means for converting said resolution increased pulse width modulated signal to a resolution increased analog output signal representative of said measured process parameter.

7. A method for use in an instrument that measures a parameter of a process and provides an analog output signal representative of said measured process parameter, said instrument having a computing device therein, said computing device having a clock signal having a predetermined number of cycles per second, a method for providing said resolution increased analog output signal representative of said measured process parameter, said method comprising the steps of:

a) measuring said process parameter and developing an analog signal representative of said measured process parameter;

b) converting said analog signal representative of said measured process parameter to a pulse width modulated signal having a least significant bit, N lower order bits one of which is said least significant bit and a predetermined number of cycles per second; and c) determining in said computing device if the resolution of a cycle of said pulse width modulated digital signal is to be increased comprising the steps of:

i. scaling said pulse width modulated signal to $2^N$ times said predetermined number of clock signal cycles per second where N is a positive nonzero integer; and ii. determining if each of said N lower order bits of said scaled pulse width modulated signal have a value of one;

d) increasing in said computing device the resolution of said cycle of said pulse width modulated signal if any of said N lower order bits in said cycle of said scaled pulse width modulated signal have a value of one by adding in $2^N$ consecutive cycles of said clock signal a value of one to said least significant bit of said pulse width modulated signal in a pattern determined by which of said N lower order bits of said scaled pulse width modulated signal have a value of one; and e) converting said resolution increased pulse width modulated signal to said resolution increased analog output signal.

8. The method of claim 7 wherein N is a one.

9. An instrument that measures a parameter of a process and provides a resolution increased analog output signal representative of said measured process parameter, said instrument comprising:

a) means for measuring said process parameter, said means developing an analog signal representative of said measured process parameter;

b) means including a computing device for converting said analog signal representative of said measured process parameter to a pulse width modulated signal having a least significant bit, N lower order bits one of which is said least significant bit and a predetermined number of cycles per second;

said computing device having a clock signal, said clock signal having a predetermined number of cycles per second, said computing device for determining if the resolution of a cycle of said pulse width modulated signal is to be increased and increasing said resolution based upon said determination, said computing device comprising:

i. means for scaling said pulse width modulated signal to $2^N$ times said predetermined number of clock signal cycles per second where N is a positive nonzero integer;

ii. means for determining if each of said N lower order bits of said scaled pulse width modulated signal have a value of one; and iii. means for increasing in said computing device the resolution of said cycle of said pulse width modulated signal if any of said N lower order bits in said cycle of said scaled pulse width modulated signal have a value of one by adding in $2^N$ consecutive cycles of said clock signal a value of one to said least significant bit of said pulse width modulated signal in a pattern determined by which of said N lower order bits of said scaled pulse width modulated signal have a value of one; and c) means for converting said resolution increased pulse width modulated signal to said resolution increased analog output signal.

10. The instrument of claim 9 wherein N is a one.

* * * * *